US008710667B2

(12) United States Patent
Hirano et al.

(10) Patent No.: US 8,710,667 B2
(45) Date of Patent: Apr. 29, 2014

(54) SEMICONDUCTOR DEVICE

(75) Inventors: Hiroshige Hirano, Nara (JP); Yukitoshi Ota, Osaka (JP)

(73) Assignee: Panasonic Corporation, Osaka (JP)

( * ) Notice: Subject to any disclaimer, the term of this patent is extended or adjusted under 35 U.S.C. 154(b) by 38 days.

(21) Appl. No.: 13/289,683

(22) Filed: Nov. 4, 2011

(65) Prior Publication Data

US 2012/0112354 A1 May 10, 2012

Related U.S. Application Data

(63) Continuation of application No. PCT/JP2009/007142, filed on Dec. 22, 2009.

(30) Foreign Application Priority Data

May 27, 2009 (JP) .................................. 2009-127377

(51) Int. Cl.
*H01L 23/48* (2006.01)

(52) U.S. Cl.
USPC ...... 257/773; 257/776; 257/E23.01; 438/618; 438/666

(58) Field of Classification Search
USPC .............. 257/773, 776, E23.01; 438/618.666
See application file for complete search history.

(56) References Cited

U.S. PATENT DOCUMENTS 6,483,714 B1    11/2002 Kabumoto et al.
6,581,201 B2 *   6/2003 Cano et al. ................. 716/111

2004/0206985 A1  10/2004 Ushiyama
2006/0157868 A1   7/2006 Katou
2009/0051035 A1   2/2009 Hirano et al.

FOREIGN PATENT DOCUMENTS

| JP | 2000-277656 | 10/2000 |
| JP | 2004-273844 | 9/2004 |
| JP | 2005-332903 | 12/2005 |
| JP | 2006-202924 | 8/2006 |
| JP | 2008-270319 | 11/2008 |
| JP | 2009-054702 | 3/2009 |

OTHER PUBLICATIONS

English Machine Translation of Japanese Patent JP 2008-270319 Date: Jun. 11, 2008 by Uchino Yukinori of Toshiba.*
International Search Report issued in International Patent Application No. PCT/JP2009/007142, mailed on Jan. 26, 2010.

* cited by examiner

*Primary Examiner* — Thinh T Nguyen
(74) *Attorney, Agent, or Firm* — McDermott Will & Emery LLP

(57) ABSTRACT

A semiconductor device includes a first interconnect layer and a second interconnect layer provided above or under the first interconnect layer. The first interconnect layer includes a plurality of first interconnect blocks, and in each of the first interconnect blocks, a first interconnect has a first potential, and extends in at least two or more directions, and a second interconnect has a second potential, and extends in at least two or more directions. The second interconnect layer includes a third interconnect which electrically connects the first interconnect of one of a pair of adjacent first interconnect blocks and the first interconnect of the other of the pair of adjacent first interconnect blocks, and a fourth interconnect which electrically connects the second interconnect of one of the pair of adjacent first interconnect blocks and the second interconnect of the other of the pair of adjacent first interconnect blocks.

11 Claims, 12 Drawing Sheets

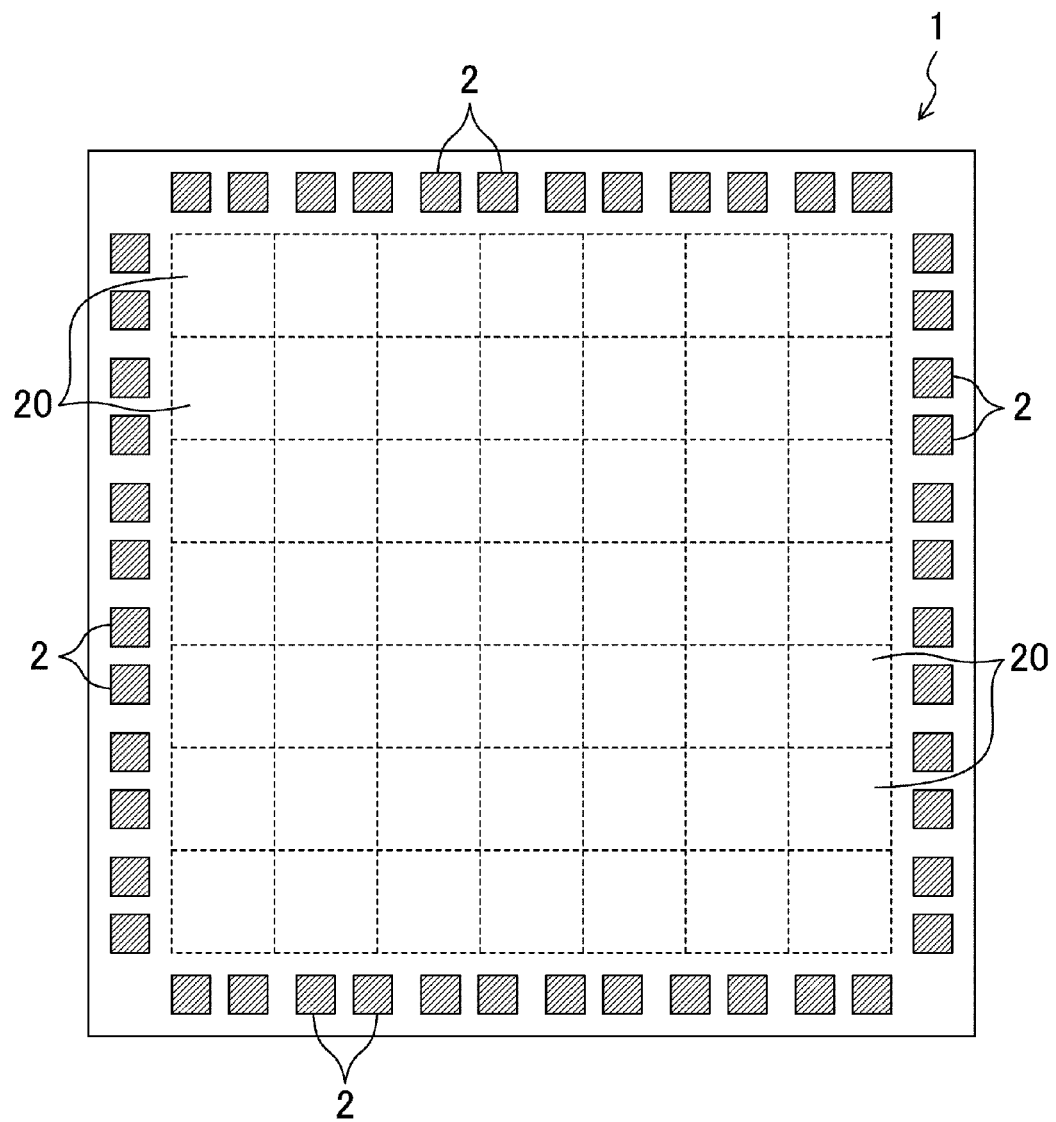

ent Application
SEMICONDUCTOR DEVICE

CROSS-REFERENCE TO RELATED APPLICATION

This is a continuation of PCT International Application PCT/JP2009/007142 filed on Dec. 22, 2009, which claims priority to Japanese Patent Application No. 2009-127377 filed on May 27, 2009. The disclosures of these applications including the specifications, the drawings, and the claims are hereby incorporated by reference in their entirety.

BACKGROUND

The present disclosure relates to interconnect structures of semiconductor integrated circuits, specifically relates to interconnect structures of power supply interconnects of the semiconductor integrated circuits.

If the power supply interconnects of the semiconductor integrated circuits are formed using two or more interconnect layers, the power supply interconnects have, in general, an interconnect structure in the shape of a mesh or similar to a mesh. In this case, to reduce a noise effect on a signal interconnect, the signal interconnect is sealed by power supply interconnects located in a lateral direction and a vertical direction of the signal interconnect (see, for example, Japanese Patent Publication No. 2005-332903).

FIG. 14 shows an example arrangement of signal interconnects and power supply interconnects in a conventional semiconductor device. In FIG. 14, the reference character "200" represents a memory core; "201" represents an $n^{th}$ layer power supply interconnect for the memory core; "202" represents an $n^{th}$ layer signal interconnect; "203" represents an $(n+1)^{th}$ layer power supply interconnect for the memory core; "204" represents an $(n+1)^{th}$ layer signal interconnect; and "205" represents a contact between interconnect layers. In the conventional semiconductor device shown in FIG. 14, power supply interconnects are arranged in the shape of a mesh, using an $n^{th}$ layer and an $(n+1)^{th}$ layer. Each of the power supply interconnects extends one-dimensionally in a predetermined direction in each of the $n^{th}$ layer and the $(n+1)^{th}$ layer.

SUMMARY

In the power supply interconnect mesh, a current is supplied from a circumference portion to a central portion of the semiconductor device. The cells located at internal points of the semiconductor integrated circuit receive a current from the power supply interconnect mesh, and use the current. Since the current is used at the internal points of the semiconductor integrated circuit, a voltage drop (a voltage decrease) in the power supply interconnect mesh increases in a direction toward the central portion of the chip. In other words, the voltage on the power supply interconnect mesh is high at the circumference portion of the semiconductor integrated circuit, and the voltage on the power supply interconnect mesh decreases in a direction toward the central portion of the semiconductor integrated circuit.

Accordingly, in the simple mesh structure of the power supply interconnects according to the conventional semiconductor device described above, a voltage drop may have a directional property, if the resistance differs between the $n^{th}$ layer and the $(n+1)^{th}$ layer due to a difference, for example, in thickness between the $n^{th}$ layer and the $(n+1)^{th}$ layer. This means that in an interconnect layer having a high resistance, a voltage drop may increase in a direction along which a power supply interconnect extends.

FIG. 15 and FIG. 16 are a top view and a cross-sectional view which schematically show simplified patterns of the power supply interconnects of the conventional semiconductor device shown in FIG. 14. FIG. 17 shows an example voltage drop due to interconnect resistance at a time when a supply voltage is applied to the simplified pattern shown in FIG. 15. In FIG. 15 to FIG. 17, like reference characters have been used to designate the same elements as the elements of the conventional semiconductor device shown in FIG. 14, and repetitive description is omitted.

As shown in FIG. 17, a supply voltage is applied from power supply pads 206, 207 connected to both ends of an $(n+1)^{th}$ layer power supply interconnect 203 for memory core. Here, the resistance of the $(n+1)^{th}$ layer power supply interconnect (i.e., a longitudinal interconnect) 203 for memory core is higher than the resistance of an $n^{th}$ layer power supply interconnect (i.e., a lateral interconnect) 201 for memory core. Thus, a sequential voltage drop occurs along the direction in which the $(n+1)^{th}$ layer power supply interconnect 203 for memory core extends, from a circumference portion to a central portion of the pattern. Here, the reference character "208" represents a region where almost no voltage drop occurs; "209" represents a region where a small voltage drop occurs; and "210" represents a region where a large voltage drop occurs.

To avoid the voltage drop, measures can be taken such as increasing the number of power supply pads, and increasing the width of the power supply interconnect. However, the benefits of such measures are limited due to a limitation of chip size, etc.

In view of this, it is an objective of the present disclosure to provide a semiconductor device which has a power supply interconnect structure capable of effectively reducing a local voltage drop.

To achieve the above objective, a semiconductor device according to the present disclosure includes a semiconductor substrate; and on the semiconductor substrate, a first interconnect layer and a second interconnect layer which is provided above or under the first interconnect layer, wherein the first interconnect layer includes a plurality of first interconnect blocks; in each of the first interconnect blocks, a first interconnect which has a first potential, and extends in at least two or more directions, and a second interconnect which has a second potential different from the first potential, and extends in at least two or more directions, are arranged; and the second interconnect layer includes a third interconnect which electrically connects between the first interconnect of one of a pair of adjacent first interconnect blocks of the plurality of first interconnect blocks and the first interconnect of the other of the pair of adjacent first interconnect blocks, and a fourth interconnect which electrically connects between the second interconnect of one of the pair of adjacent first interconnect blocks and the second interconnect of the other of the pair of adjacent first interconnect blocks.

According to the semiconductor device of the present disclosure, both of the first interconnect and the second interconnect provided in the first interconnect layer extend in two or more directions. Thus, unlike the case of the conventional semiconductor device in which a power supply interconnect in each interconnect layer extends in only one direction, it is possible to avoid the situation where a voltage drop has a directional property.

Further, according to the semiconductor device of the present disclosure, both of the first interconnect and the second interconnect provided in the first interconnect layer are two-dimensionally formed (i.e., extend in two or more directions). Thus, compared to the conventional case in which the power supply interconnect is one-dimensionally formed (i.e., extends in only one direction), a resistance value of each interconnect can be reduced.

Consequently, according to the semiconductor device of the present disclosure, it is possible to provide a power supply interconnect structure capable of effectively reducing a local voltage drop in a chip.

In the semiconductor device of the present disclosure, a supply voltage (Vdd) may include a plurality of voltages. For example, in addition to the first interconnect having the first potential, and the second interconnect having the second potential different from the first potential, another interconnect having a potential different from the first potential and the second potential may be arranged in each of the first interconnect blocks of the first interconnect layer, in the semiconductor device of the present disclosure.

In the semiconductor device of the present disclosure, an arrangement of the first interconnect and the second interconnect in one of the pair of first interconnect blocks may be different from an arrangement of the first interconnect and the second interconnect in the other of the pair of first interconnect blocks. With this structure, no difference between resistances of the first interconnect and the second interconnect can be found.

In the semiconductor device of the present disclosure, the second interconnect layer may include a plurality of second interconnect blocks in each of which the third interconnect and the fourth interconnect are arranged. Here, each of the first interconnect blocks of the first interconnect layer may be displaced from each of the second interconnect blocks of the second interconnect layer. In this case, each of the third interconnect and the fourth interconnect may extend in two or more directions. With this structure, the effect of the semiconductor device according to the present disclosure described above is more significant, compared to the conventional semiconductor device.

In the semiconductor device of the present disclosure, if the first interconnect and the third interconnect have different resistances, and the second interconnect and the fourth interconnect have different resistances, in other words, if the resistance differs between the first interconnect layer and the second interconnect layer, the effect of the semiconductor device according to the present disclosure described above is more significant, compared to the conventional semiconductor device.

In the semiconductor device of the present disclosure, the first interconnect and the third interconnect may be electrically connected to each other via a first contact, and the second interconnect and the fourth interconnect may be electrically connected to each other via a second contact.

In the semiconductor device of the present disclosure, each of the first interconnect and the second interconnect is in the shape of a ring. With this structure, it is possible to reliably obtain the effect of the semiconductor device according to the present disclosure described above.

In the semiconductor device of the present disclosure, each of the first interconnect and the second interconnect is in the shape of a spiral. With this structure, it is possible to reliably obtain the effect of the semiconductor device according to the present disclosure described above. Further, similar to the case in which each of the first interconnect and the second interconnect is formed to have a ring shape, it is possible to easily arrange contacts for electrically connecting between the first interconnect and the third interconnect, and between the second interconnect and the fourth interconnect. Moreover, compared to the case in which each of the first interconnect and the second interconnect is formed to have a ring shape, the interconnects can be extended over wider areas without the contacts, and therefore, resistances of the interconnects can be further reduced.

In the semiconductor device of the present disclosure, a signal interconnect may be arranged between the first interconnect blocks of the first interconnect layer.

In the semiconductor device of the present disclosure, the plurality of first interconnect blocks may be arranged in a direction along sides of the semiconductor substrate. With this structure, a voltage drop in the direction along sides of the semiconductor substrate (i.e., chip edge direction) can be reduced, and therefore, this structure is useful for a configuration in which power supply pads are regularly located at a chip circumference portion.

In the semiconductor device of the present disclosure, the semiconductor substrate may be in the shape of a rectangle when viewed from above, and the plurality of first interconnect blocks may be arranged in an oblique direction relative to the direction along sides of the semiconductor substrate. In particular, the semiconductor substrate may be in the shape of a square when viewed from above, and the plurality of first interconnect blocks may be arranged in a direction 45 degrees from the direction along sides of the semiconductor substrate. With this structure, a voltage drop in a direction 45 degrees from the chip edge direction can be reduced in a general square chip, and therefore, this structure is useful for a configuration in which a lot of power supply pads are arranged at a chip corner portion.

In the semiconductor device of the present disclosure, each of the third interconnect and the fourth interconnect may be in the shape of a ring. With this structure, it is possible to reliably obtain the effect of the semiconductor device according to the present disclosure described above.

As described above, according to the present disclosure, it is possible to avoid the situation where a voltage drop has a directional property, and therefore, a local voltage drop in the semiconductor device can be effectively reduced. As a result, the semiconductor device can be stably operated, and a chip area can be reduced.

BRIEF DESCRIPTION OF THE DRAWINGS

FIG. 9 is a plan view showing an example arrangement of the interconnect blocks described in the embodiments of the present disclosure (and the variations thereof) in a semiconductor chip.

DETAILED DESCRIPTION

First Embodiment

A semiconductor device according to the first embodiment of the present disclosure will be described below with reference to the drawings.

Figure 1A:
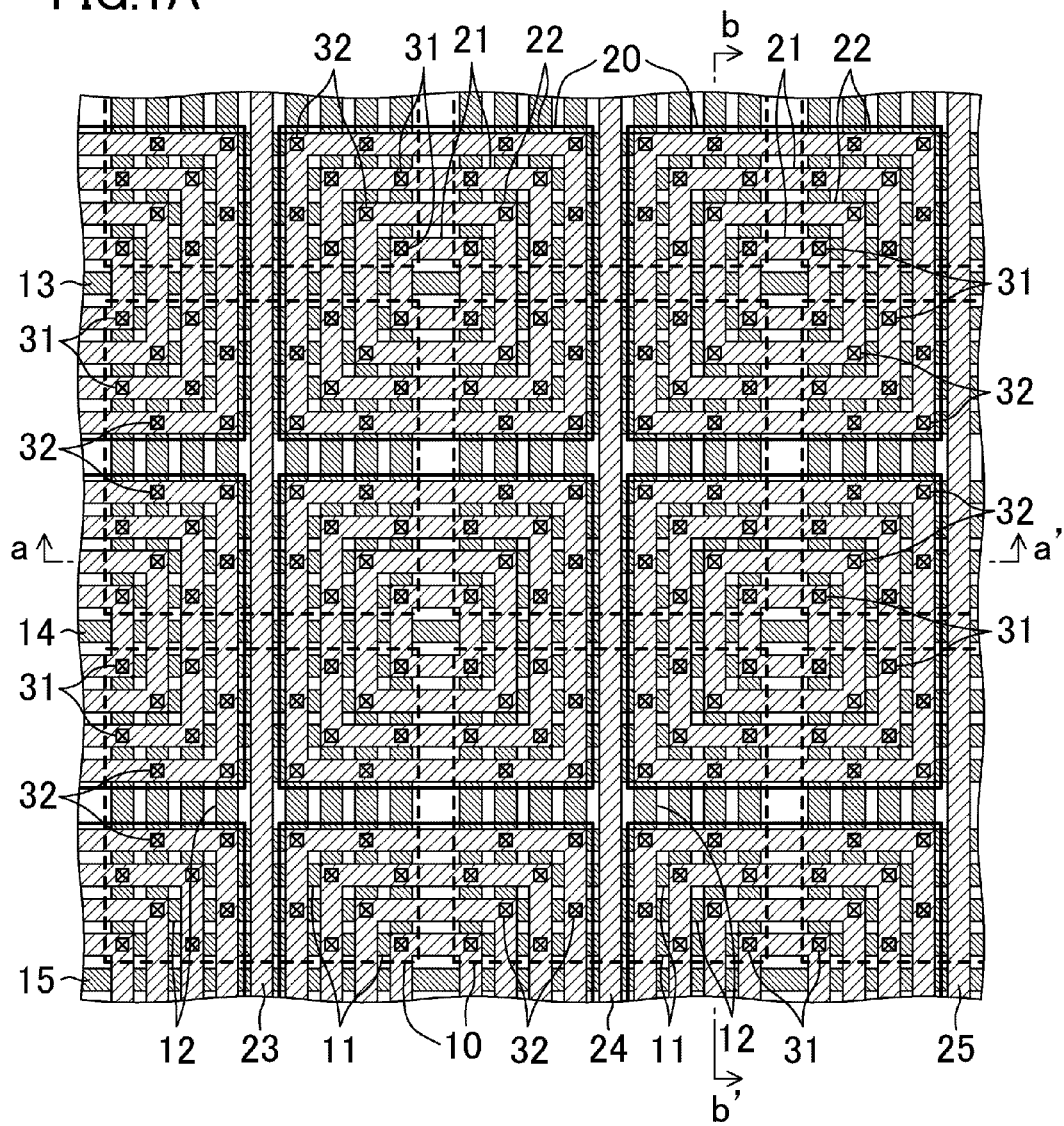
FIG. 1A is a plan view of a semiconductor device according to the first embodiment of the present disclosure.
Figure 1B:
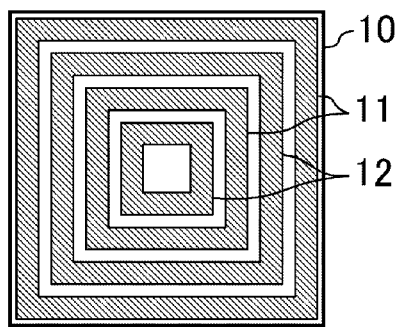
FIG. 1B shows an interconnect block of a lower interconnect layer of the semiconductor device according to the first embodiment of the present disclosure.
Figure 1C:
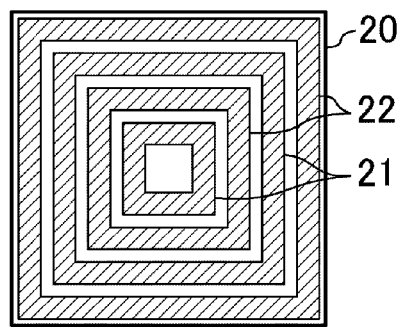
FIG. 1C shows an interconnect block of an upper interconnect layer of the semiconductor device according to the first embodiment of the present disclosure.
Figure 2:
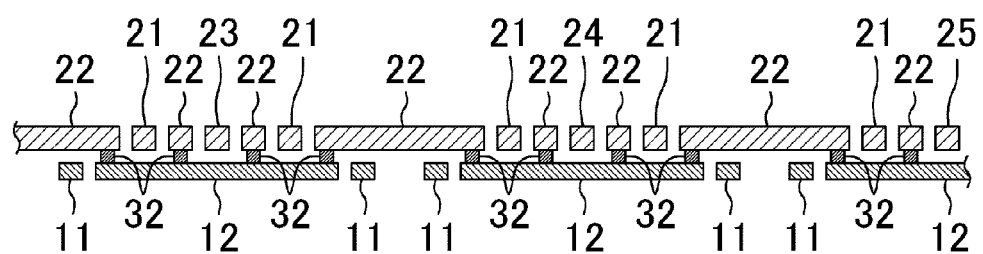
FIG. 2 is a cross-sectional view taken along the line a-a' of FIG. 1A.
Figure 3:
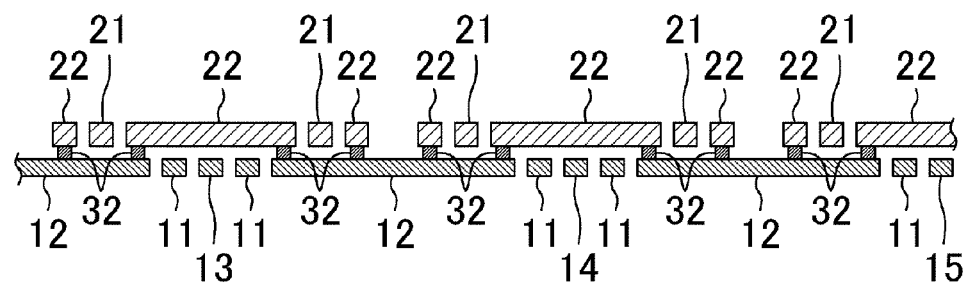
FIG. 3 is a cross-sectional view taken along the line b-b' of FIG. 1A.

FIG. 1A is a plan view of a semiconductor device according to the first embodiment. FIG. 1B shows an interconnect block of a lower interconnect layer of the semiconductor device according to the first embodiment. FIG. 1C shows an interconnect block of an upper interconnect layer of the semiconductor device according to the first embodiment. FIG. 2 is a cross-sectional view taken along the line a-a' of FIG. 1A. FIG. 3 is a cross-sectional view taken along the line b-b' of FIG. 1A.

As shown in FIG. 1A, in the semiconductor device of the present embodiment, a first interconnect layer having a plurality of first interconnect blocks 10 (areas surrounded by the dotted lines in the drawing) is provided on a semiconductor substrate (not shown), and a second interconnect layer having a plurality of second interconnect blocks 20 (areas surrounded by solid lines in the drawing) is provided on the first interconnect layer. Here, the plurality of first interconnect blocks 10 and the plurality of second interconnect blocks 20 are arranged in a matrix, and each of the first interconnect blocks 10 is displaced from each of the second interconnect blocks 20. Specifically, the blocks are arranged such that the center of a group of four adjacent first interconnect blocks 10 which are arranged in a 2×2 matrix, coincides with the center of one second interconnect block 20. In other words, the blocks are arranged such that the center of a group of four adjacent second interconnect blocks 20 which are arranged in a 2×2 matrix, coincides with the center of one first interconnect block 10. The arrangement of the blocks are the same in other embodiments and variations thereof described later.

As shown in FIG. 1B, each of the first interconnect blocks 10 includes four concentric ring interconnects in which power supply interconnects and ground interconnects are alternately arranged. Specifically, a power supply interconnect 11, a ground interconnect 12, a power supply interconnect 11, and a ground interconnect 12, all in the shape of a ring, are sequentially provided from the outer side. Here, a supply voltage is applied to each of the power supply interconnects 11, and a ground voltage is applied to each of the ground interconnects 12.

As shown in FIG. 1C, each of the second interconnect blocks 20 includes four concentric ring interconnects in which power supply interconnects and ground interconnects are alternately arranged. Specifically, a ground interconnect 22, a power supply interconnect 21, a ground interconnect 22, and a power supply interconnect 21, all in the shape of a ring, are sequentially provided from the outer side. Here, a supply voltage is applied to each of the power supply interconnects 21, and a ground voltage is applied to each of the ground interconnects 22.

As shown in FIG. 1A, FIG. 2, and FIG. 3, the power supply interconnects 11 of the first interconnect blocks 10 are electrically connected to the power supply interconnects 21 of the second interconnect blocks 20 via first contacts 31. The ground interconnects 12 of the first interconnect blocks 10 are electrically connected to the ground interconnects 22 of the second interconnect blocks 20 via second contacts 32. Here, since each of the first interconnect blocks 10 is displaced from each of the second interconnect blocks 20, the power supply interconnect 11 of one of a pair of adjacent first interconnect blocks 10 is electrically connected to the power supply interconnect 11 of the other of the pair of adjacent first interconnect blocks 10 via the power supply interconnect 21 of the corresponding second interconnect block 20, and the ground interconnect 12 of one of a pair of adjacent first interconnect blocks 10 is electrically connected to the ground interconnect 12 of the other of the pair of adjacent first interconnect blocks 10 via the ground interconnect 22 of the corresponding second interconnect block 20. Similarly, the power supply interconnect 21 of one of a pair of adjacent second interconnect blocks 20 is electrically connected to the power supply interconnect 21 of the other of the pair of adjacent second interconnect blocks 20 via the power supply interconnect 11 of the corresponding first interconnect block 10, and the ground interconnect 22 of one of a pair of adjacent second interconnect blocks 20 is electrically connected to the ground interconnect 22 of the other of the pair of adjacent second interconnect blocks 20 via the ground interconnect 12 of the corresponding first interconnect block 10. With this structure, a power supply interconnect mesh and a ground interconnect mesh are formed throughout the chip.

Further, as shown in FIG. 1A, FIG. 2 and FIG. 3, signal interconnects 13-15 which, unlike the power supply interconnects 11 and ground interconnects 12, extend in one direction are provided between the first interconnect blocks 10 of the first interconnect layer. Also, signal interconnects 23-25 which, unlike the power supply interconnects 21 and the ground interconnects 22, extend in one direction are provided between the second interconnect blocks 20 of the second interconnect layer. That is, in the present embodiment, not only the power supply interconnects and the ground interconnects, but also the signal interconnects are formed in the first interconnect layer and the second interconnect layer.

In the present embodiment, copper interconnects having, for example, a thickness of about 0.3 μm is used as the interconnects 11-15 of the first interconnect layer, and copper interconnects having, for example, a thickness of about 1.5 μm, which is five times the thickness of each of the interconnects 11-15 of the first interconnect layer, is used as the interconnects 21-25 of the second interconnect layer. Here, the width of each of the interconnects is, for example, about 10 μm, and the space between the interconnects is, for example, about 2.5 μm in both of the first interconnect layer and the second interconnect layer. This means that the resistance of each of the interconnects 11-15 of the first interconnect layer is about five times the resistance of each of the interconnects 21-25 of the second interconnect layer.

According to the present embodiment described above, both of the power supply interconnect 11 and the ground interconnect 12 provided in the first interconnect layer are in the shape of a ring. Thus, unlike the case of the conventional semiconductor device in which the power supply interconnect and the ground interconnect extend in only one direction in each interconnect layer, it is possible to avoid the situation where a voltage drop has a directional property. Particularly if the resistance differs between the first interconnect layer and the second interconnect layer as in the present embodiment, the above effect is more significant, compared to the conventional semiconductor device.

Further, according to the present embodiment, both of the power supply interconnect 11 and the ground interconnect 12 provided in the first interconnect layer are two-dimensionally formed (i.e., extend in two or more directions). Thus, compared to the conventional case in which the power supply interconnect and the ground interconnect are one-dimensionally formed (i.e., extend in only one direction), a resistance value per unit area in each block can be reduced by about 20%.

Consequently, according to the present embodiment, it is possible to provide a power supply interconnect structure capable of effectively reducing a local voltage drop in a chip. Since a local voltage drop in a semiconductor device can be effectively reduced, the semiconductor device can be stably operated, and the chip area can also be reduced.

Further, according to the present embodiment, both of the power supply interconnect 21 and the ground interconnect 22 provided in the second interconnect layer are in the shape of a ring. Thus, the effect as described in the present embodiment is more significant, compared to the conventional semiconductor device.

In the first embodiment, the order of arrangement of the power supply interconnects 11 and the ground interconnects 12 in each of the first interconnect blocks 10 may be altered, and the order of arrangement of the power supply interconnects 21 and the ground interconnect 22 in each of the second interconnect blocks 20 may also be altered. Further, the four concentric ring interconnects provided in the first interconnect blocks 10 and the second interconnect blocks 20 may be replaced with two concentric ring interconnects, three concentric ring interconnects, or five or more concentric ring interconnects. Moreover, the structure of the ring interconnect may differ between the first interconnect block 10 and the second interconnect block 20.

Although not shown, in the first embodiment, each of the signal interconnects 13-15 of the first interconnect layer may be provided with a contact for establishing electrical connection with the substrate or an interconnect layer under the first interconnect layer, or with the second interconnect layer or a pad above the first interconnect layer. Further, each of the signal interconnects 23-25 of the second interconnect layer may be provided with a contact for establishing electrical connection with the substrate or an interconnect layer such as the first interconnect layer under the second interconnect layer, or with a pad above the second interconnect layer.

In the first embodiment, the signal interconnects 13-15 are arranged between the first interconnect blocks 10 of the first interconnect layer, and the signal interconnects 23-25 are arranged between the plurality of second interconnect blocks 20 of the second interconnect layer. Alternatively, the signal interconnects 13-15, 23-25 may not be provided. In other words, only the power supply interconnects 11 and the ground interconnects 12 may be arranged in the first interconnect layer, and only the power supply interconnects 21 and the ground interconnects 22 may be arranged in the second interconnect layer. With this structure, the power supply interconnects and the ground interconnects can be provided throughout the interconnect layers without wasted space. Thus, compared to the case where the signal interconnects 13-15, 23-25 are provided, the resistance values of the power supply interconnects and the ground interconnects can be further reduced by about 5%.

Variation of the First Embodiment

A semiconductor device according to a variation of the first embodiment of the present disclosure will be described below with reference to the drawings.

Figure 4A:
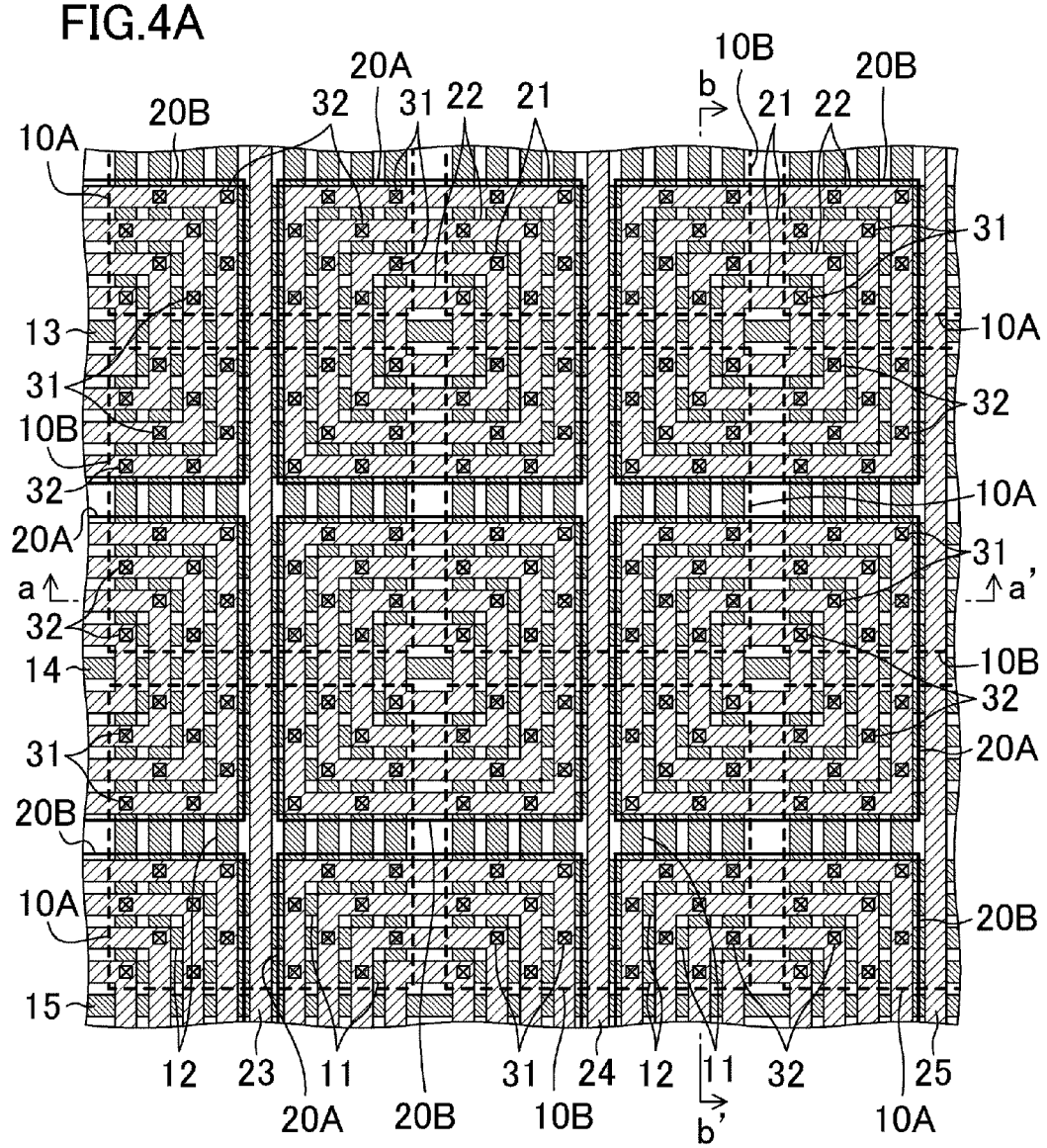
FIG. 4A is a plan view of a semiconductor device according to a variation of the first embodiment of the present disclosure. Each of FIG. 4B
Figure 4B:
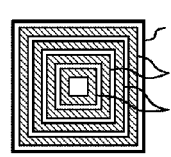
FIG. 4C shows an interconnect block of a lower interconnect layer of the semiconductor device according to the variation of the first embodiment of the present disclosure. Each of FIG. 4D
FIG. 4E shows an interconnect block of an upper interconnect layer of the semiconductor device according to the variation of the first embodiment of the present disclosure.
Figure 4C:
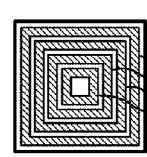
Figure 4D:
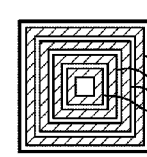
Figure 4E:
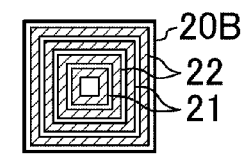
Figure 5:
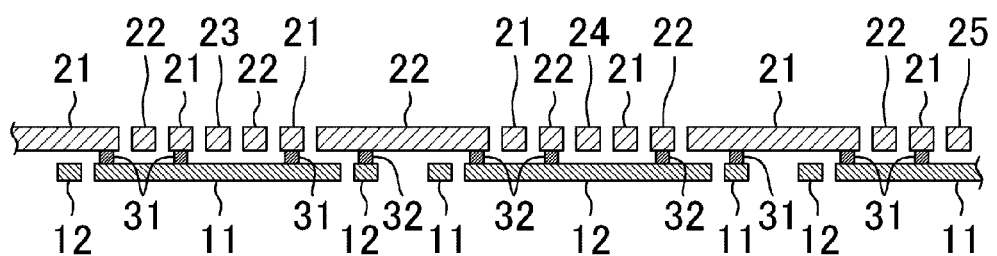
FIG. 5 is a cross-sectional view taken along the line a-a' of FIG. 4A.
Figure 6:
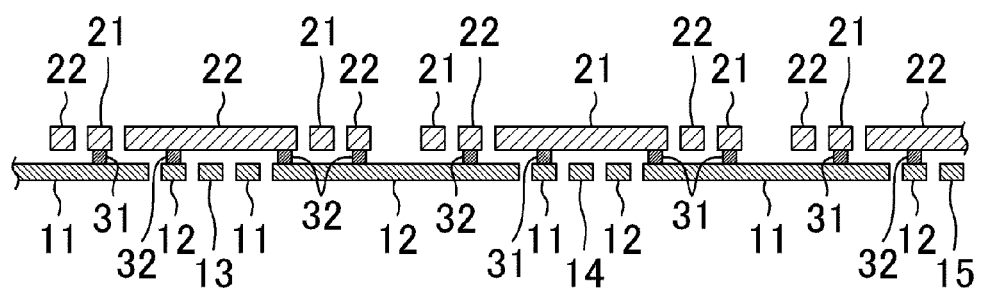
FIG. 6 is a cross-sectional view taken along the line b-b' of FIG. 4A.

FIG. 4A is a plan view of a semiconductor device according to a variation of the first embodiment. Each of FIG. 4B and FIG. 4C shows an interconnect block of a lower interconnect layer of the semiconductor device according to the variation of the first embodiment. Each of FIG. 4D and FIG. 4E shows an interconnect block of an upper interconnect layer of the semiconductor device according to the variation of the first embodiment. FIG. 5 is a cross-sectional view taken along the line a-a' of FIG. 4A. FIG. 6 is a cross-sectional view taken along the line b-b' of FIG. 4A.

In FIGS. 4A-4E, FIG. 5 and FIG. 6, like reference characters have been used to designate the same elements as the elements of the first embodiment shown in FIGS. 1A-1C, FIG. 2 and FIG. 3, and repetitive description is omitted.

The first point of the present variation which differs from the first embodiment is that two types of first interconnect blocks 10A and 10B in which power supply interconnects 11 and ground interconnects 12 are arranged in a different order, are alternately arranged next to each other as first interconnect blocks 10, as shown in FIGS. 4A-4C. Here, each of the first interconnect blocks 10A includes four concentric ring interconnects in which a power supply interconnect 11, a ground interconnect 12, a power supply interconnect 11, and a ground interconnect 12, all in the shape of a ring, are sequentially provided from the outer side. Similarly, each of the first interconnect blocks 10B includes four concentric ring interconnects in which a ground interconnect 12, a power supply interconnect 11, a ground interconnect 12, and a power supply interconnect 11, all in the shape of a ring, are sequentially provided from the outer side.

The second point of the present variation which differs from the first embodiment is that two types of second interconnect blocks 20A and 20B in which power supply interconnects 21 and ground interconnects 22 are arranged in a different order, are alternately arranged next to each other as second interconnect blocks 20, as shown in FIGS. 4A, 4D and 4E. Here, each of the second interconnect blocks 20A includes four concentric ring interconnects in which a power supply interconnect 21, a ground interconnect 22, a power supply interconnect 21, and a ground interconnect 22, all in the shape of a ring, are sequentially provided from the outer side. Similarly, each of the second interconnect blocks 20B includes four concentric ring interconnects in which a ground interconnect 22, a power supply interconnect 21, a ground interconnect 22, and a power supply interconnect 21, all in the shape of a ring, are sequentially provided from the outer side.

According to the present variation described above, the following effect can be obtained in addition to the effect described in the first embodiment. That is, since the order of arrangement of the power supply interconnects 11 and the ground interconnects 12 in the first interconnect block 10A is opposite to the order of the arrangement of the power supply interconnects 11 and the ground interconnects 12 in the first interconnect block 10B adjacent to the first interconnect block 10A, no difference of resistances between the power supply interconnects 11 and the ground interconnects 12 can be found. Similarly, since the order of arrangement of the power supply interconnects 21 and the ground interconnects 22 in the second interconnect block 20A is opposite to the order of arrangement of the power supply interconnects 21 and the ground interconnects 22 in the second interconnect block 20B adjacent to the second interconnect block 20A, no difference of resistances between the power supply interconnects 21 and the ground interconnects 22 can be found.

Second Embodiment

A semiconductor device according to the second embodiment of the present disclosure will be described below with reference to the drawings.

Figure 7A:
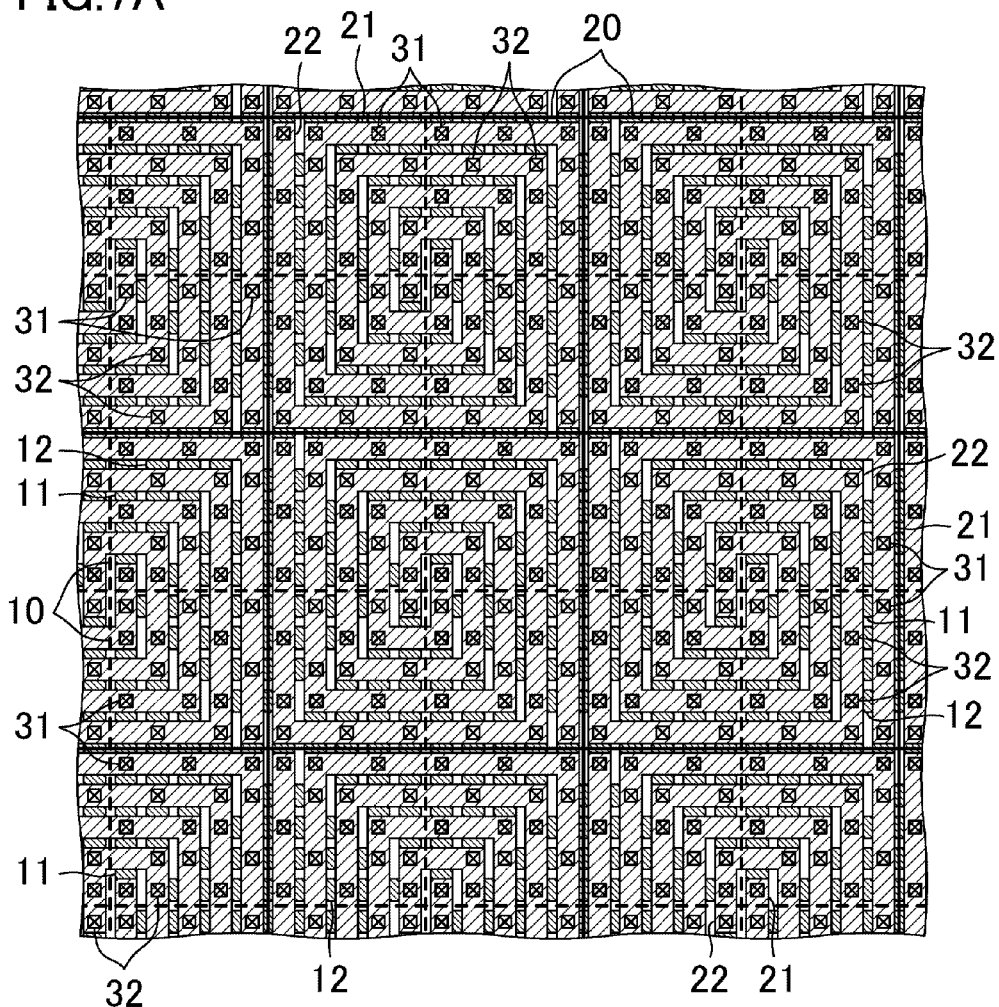
FIG. 7A is a plan view of a semiconductor device according to the second embodiment of the present disclosure.
Figure 7B:
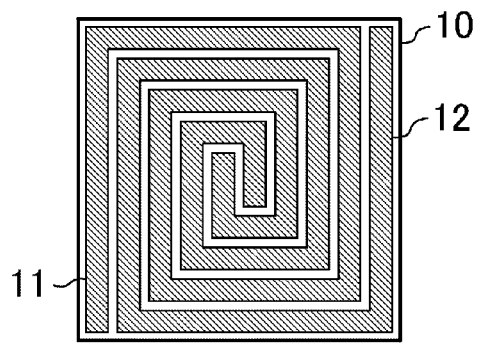
FIG. 7B shows an interconnect block of a lower interconnect layer of the semiconductor device according to the second embodiment of the present disclosure.
Figure 7C:
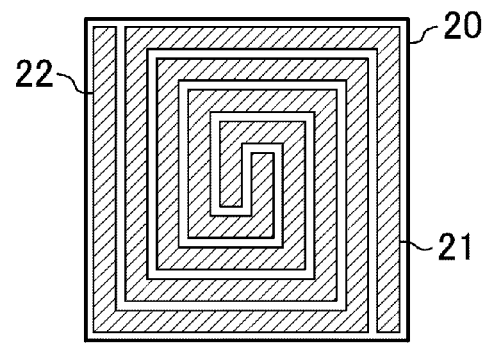
FIG. 7C shows an interconnect block of an upper interconnect layer of the semiconductor device according to the second embodiment of the present disclosure.

FIG. 7A is a plan view of a semiconductor device according to the second embodiment. FIG. 7B shows an interconnect block of a lower interconnect layer of the semiconductor device according to the second embodiment. FIG. 7C shows an interconnect block of an upper interconnect layer of the semiconductor device according to the second embodiment. In FIGS. 7A-7C, like reference characters have been used to designate the same elements as the elements of the first embodiment shown in FIGS. 1A-1C, and repetitive description is omitted.

A point of the present embodiment which differs from the first embodiment is that, as shown in FIGS. 7A-7C, each of first interconnect blocks 10 includes one spiral power supply interconnect 11 and one spiral ground interconnect 12, and each of second interconnect blocks 20 includes one spiral power supply interconnect 21 and one spiral ground interconnect 22.

According to the present embodiment described above, the following effect can be obtained in addition to the effect described in the first embodiment. That is, similar to the case in which the power supply interconnect 11, the ground interconnect 12, the power supply interconnect 21 and the ground interconnect 22 are formed to have a ring shape, it is possible to easily arrange contacts for electrically connecting between the power supply interconnect 11 and the ground interconnect 21, and between the power supply interconnect 12 and the ground interconnect 22. Further, since the power supply interconnect 11, the ground interconnect 12, the power supply interconnect 21 and the ground interconnect 22 are formed to have a spiral shape, the interconnects can be extended over wider areas without the contacts 31, 32, and therefore, resistances of the interconnects can be further reduced, compared to the case in which the power supply interconnect 11, the ground interconnect 12, the power supply interconnect 21 and the ground interconnect 22 are formed to have a ring shape.

In the second embodiment, the order of arrangement of the power supply interconnect 11 and the ground interconnect 12 in each first interconnect block 10 may be altered, and the order of arrangement of the power supply interconnect 21 and the ground interconnect 22 in each second interconnect block 20 may also be altered. Of course, the number of turns of the power supply interconnect 11, the ground interconnect 12, the power supply interconnect 21, and the ground interconnect 22 as spiral interconnects, is not specifically limited. Further, the structure of the spiral interconnects may differ between the first interconnect block 10 and the second interconnect block 20.

In the second embodiment, both of the first interconnect block 10 and the second interconnect block 20 include the spiral interconnects. However, in place of the spiral interconnects, the first interconnect block 10 may include a ring-shaped interconnect similar to the interconnect in the first embodiment as the power supply interconnect 11 and the ground interconnect 12, and the second interconnect block 20 may include a spiral interconnect similar to the interconnect in the present embodiment as the power supply interconnect 21 and the ground interconnect 22. Alternatively, the first interconnect blocks 10 may include a spiral interconnect similar to the interconnect in the present embodiment as the power supply interconnect 11 and the ground interconnect 12, and the second interconnect blocks 20 may include a ring-shaped interconnect similar to the interconnect in the first embodiment as the power supply interconnect 21 and the ground interconnect 22.

In the second embodiment, a signal interconnect may be provided between the first interconnect blocks 10A and 10B in the first interconnect layer, and another signal interconnect may be provided between the second interconnect blocks 20A and 20B in the second interconnect layer.

Variation of the Second Embodiment

A semiconductor device according to a variation of the second embodiment of the present disclosure will be described with reference to the drawings.

Figure 8A:
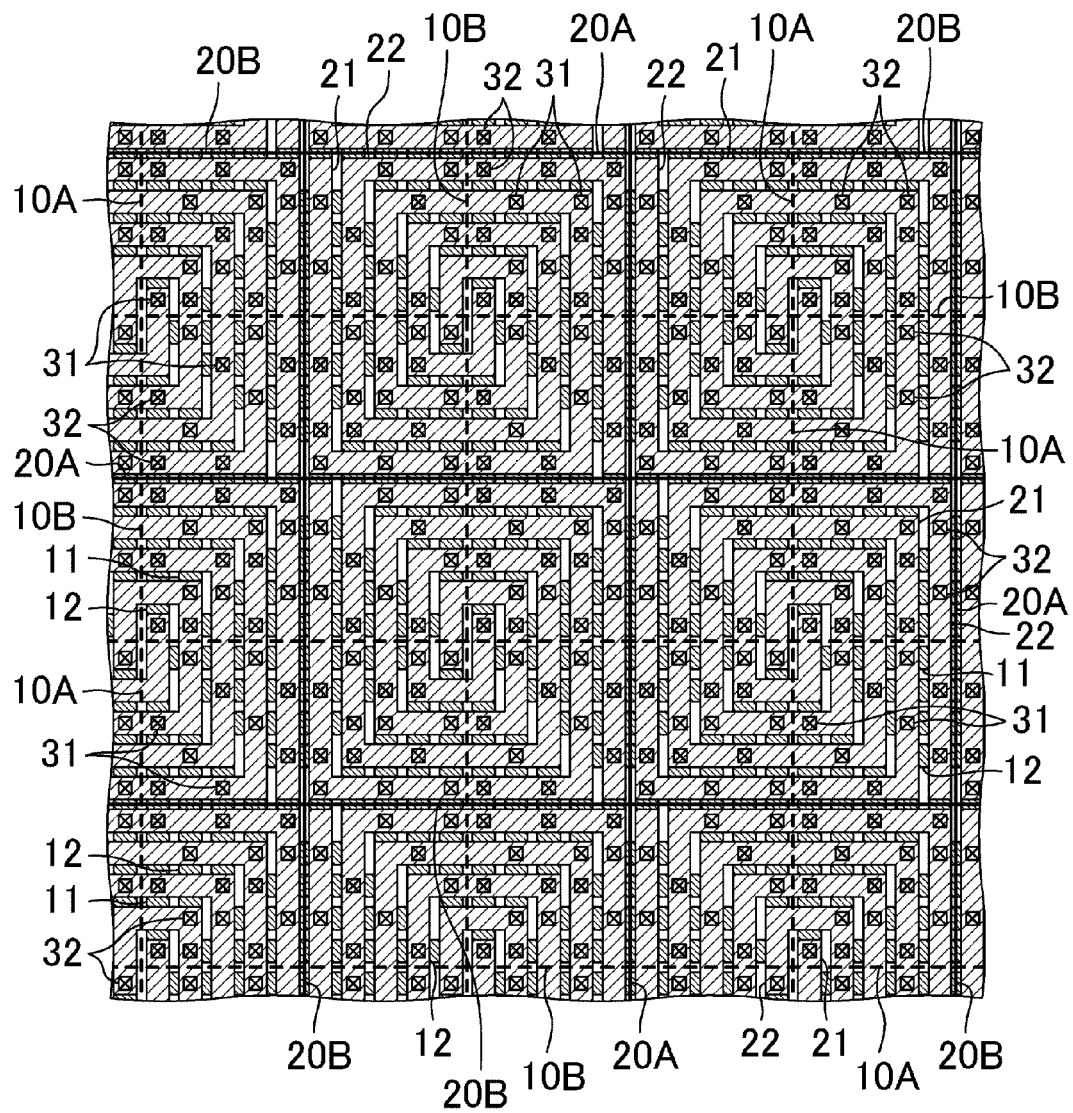
FIG. 8A is a plan view of a semiconductor device according to a variation of the second embodiment of the present disclosure. Each of FIG. 8B
Figure 8B:
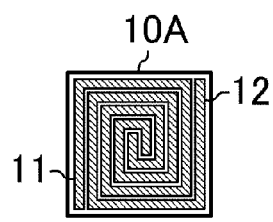
FIG. 8C shows an interconnect block of a lower interconnect layer of the semiconductor device according to the variation of the second embodiment of the present disclosure. Each of FIG. 8D
FIG. 8E shows an interconnect block of an upper interconnect layer of the semiconductor device according to the variation of the second embodiment of the present disclosure.
Figure 8C:
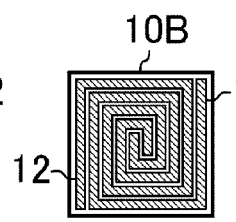

FIG. 8A is a plan view of a semiconductor device according to a variation of the second embodiment. Each of FIG. 8B and FIG. 8C shows an interconnect block of a lower interconnect layer of the semiconductor device according to the variation of the second embodiment. Each of FIG. 8D and FIG. 8E shows an interconnect block of an upper interconnect layer of the semiconductor device according to the variation of the second embodiment.

In FIGS. 8A-8E, like reference characters have been used to designate the same elements as the elements of the first embodiment shown in FIGS. 1A-1C and the second embodiment shown in FIGS. 7A-7C, and repetitive description is omitted.

The first point of the present variation which differs from the second embodiment is that two types of first interconnect blocks 10A and 10B in which a spiral power supply interconnect 11 and a spiral ground interconnect 12 are arranged in a different manner, are alternately arranged next to each other as first interconnect blocks 10, as shown in FIGS. 8A-8C.

Figure 8D:
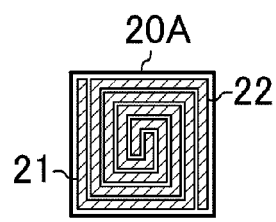
Figure 8E:
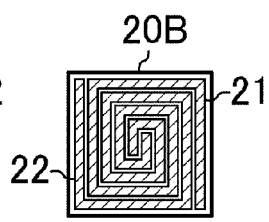

The second point of the present variation which differs from the second embodiment is that two types of second interconnect blocks 20A and 20B in which a spiral power supply interconnect 21 and a spiral ground interconnect 22 are arranged in a different manner, are alternately arranged next to each other as second interconnect blocks 20, as shown in FIGS. 8A, 8D and 8 E.

According to the present variation described above, the following effect can be obtained in addition to the effect described in the second embodiment. That is, since the manner of arrangement of the power supply interconnect 11 and the ground interconnect 12 in the first interconnect block 10A is different from the manner of arrangement of the power supply interconnect 11 and the ground interconnect 12 in the first interconnect block 10B adjacent to the first interconnect block 10A, no difference of resistances between the power supply interconnect 11 and the ground interconnect 12 can be found. Similarly, since the manner of arrangement of the power supply interconnect 21 and the ground interconnect 22 in the second interconnect block 20A is different from the manner of arrangement of the power supply interconnect 21 and the ground interconnect 22 in the second interconnect block 20B adjacent to the second interconnect block 20A, no difference of resistances between the power supply interconnect 21 and the ground interconnect 22 can be found.

In the above embodiments (including the variations, the same hereinafter), the supply voltage may include a plurality of voltages. In other words, two or more types of power supply interconnects may be provided in each of the interconnect blocks of the interconnect layers, for applying two or more different supply voltages.

In the above embodiments, the size of each interconnect block is not specifically limited. For example, the dimension of one side may be in a range of from about 100 μm to about 400 μm. However, in the case where a contact resistance is high, it is preferable that the blocks are in a large size to a certain degree to reduce an influence of the contact resistance. On the other hand, if the contact resistance is low, the blocks may be in a small size as far as a plurality of ring interconnects or spiral interconnects can be arranged therein.

FIG. 9 is a plan view showing an example arrangement of the interconnect blocks of the above embodiments (specifically, the second interconnect blocks of the second interconnect layer as an upper interconnect layer) in a semiconductor chip. As shown in FIG. 9, a plurality of pads 2 are located at a circumference portion of a rectangular semiconductor chip 1, and a plurality of second interconnect blocks 20 are located in an area surrounded by the area where the pads 2 are located, in a direction along sides of the semiconductor chip 1 (i.e., a semiconductor substrate). In other words, the second interconnect blocks 20 are arranged in the same direction as the chip edge direction. With this structure, a voltage drop along the chip edge direction can be reduced, and therefore, this structure is useful for a configuration in which power supply pads are regularly located at a chip circumference portion.

Figure 10:
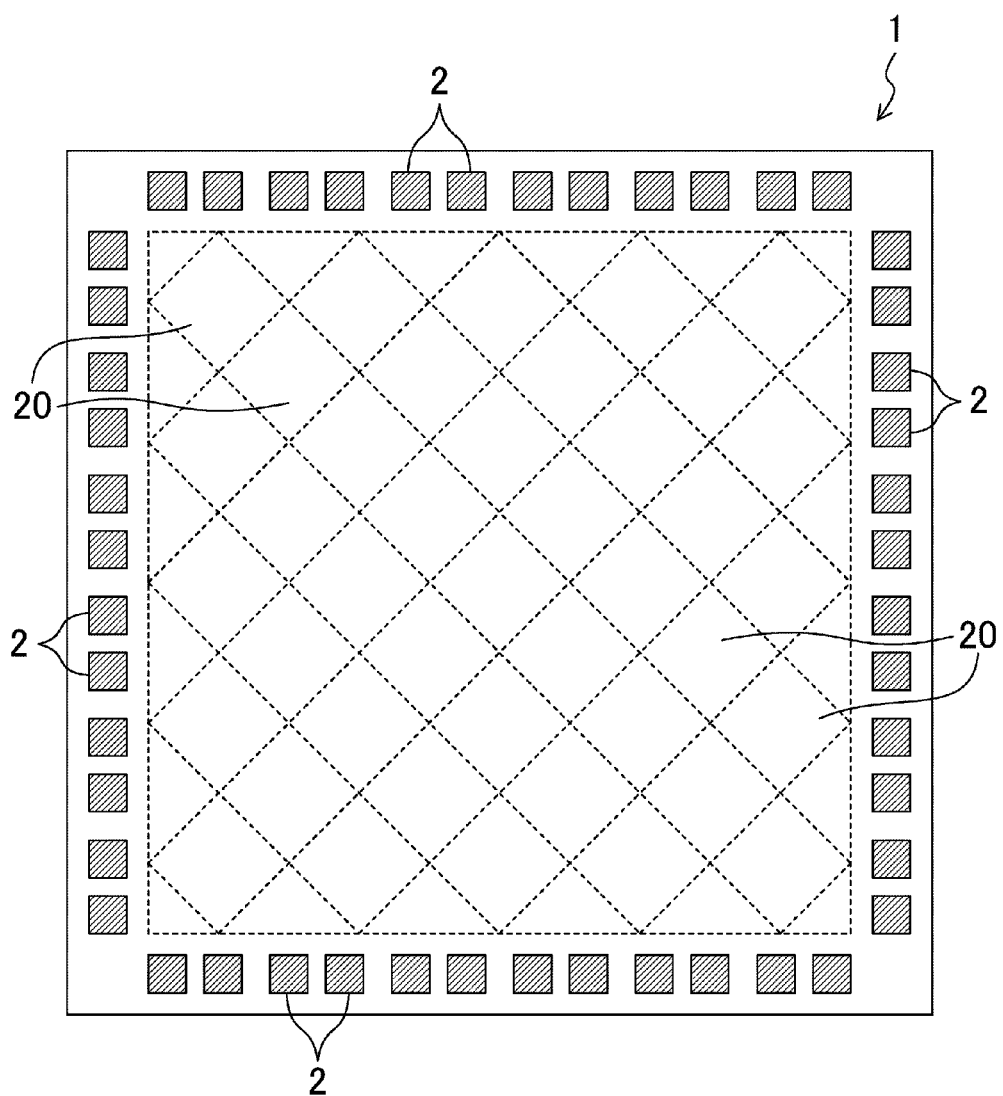
FIG. 10 is a plan view showing an another example arrangement of the interconnect blocks described in the embodiments of the present disclosure (and the variations thereof) in a semiconductor chip.

FIG. 10 is a plan view showing another example arrangement of the interconnect blocks of the above embodiments (specifically, the second interconnect blocks of the second interconnect layer as an upper interconnect layer) in a semiconductor chip. As shown in FIG. 10, a plurality of pads 2 are located at a circumference portion of a square semiconductor chip 1, and a plurality of second interconnect blocks 20 are located in an area surrounded by the area where the pads 2 are located, in a diagonal direction of the semiconductor chip 1 (i.e., a semiconductor substrate), that is, in a direction which is shifted 45 degrees from the chip edge direction. With this structure, a voltage drop in a direction which is shifted 45 degrees from the chip edge direction (a diagonal direction of the chip) can be reduced, and therefore, this structure is useful for a configuration in which a lot of power supply pads are arranged at a chip corner portion. Although, in this structure, parts of some of the second interconnect blocks 20 are cut off along the edges of the chip, the power supply interconnects 21 and the ground interconnects 22 in such second interconnect blocks 20 are electrically connected to the power supply interconnects 11 and the ground interconnects 12 of the first interconnect layer (i.e., a lower interconnect layer) via the contacts 31 and 32, respectively. Thus, a power supply interconnect mesh and a ground interconnect mesh which are effective throughout the chip are formed. In FIG. 10, the semiconductor chip 1 is in the shape of a square. If the semiconductor chip 1 is a rectangle, the plurality of second interconnect blocks 20 may be arranged in a diagonal direction of the semiconductor chip 1 (i.e., a semiconductor substrate), that is, in an oblique direction relative to the chip edge direction.

In FIG. 9 and FIG. 10, although not shown in the drawings, the first interconnect blocks 10 of the first interconnect layer as a lower interconnect layer, too, may be arranged in the same direction as the chip edge direction, or may be arranged in an oblique direction relative to the chip edge direction.

In FIG. 9 and FIG. 10, the second interconnect layer (or an upper interconnect layer) is the uppermost layer of the chip at which the pads are also provided. However, the second interconnect layer may be an interconnect layer located directly under the pads, or a different interconnect layer may be interposed between the second interconnect layer and the uppermost layer of the chip.

In FIG. 9 and FIG. 10, the pads 2 are located at the circumference portion of the semiconductor chip 1. Instead, a pad (or an area pad) may be located on the entire surface of the semiconductor chip 1.

Figure 11:
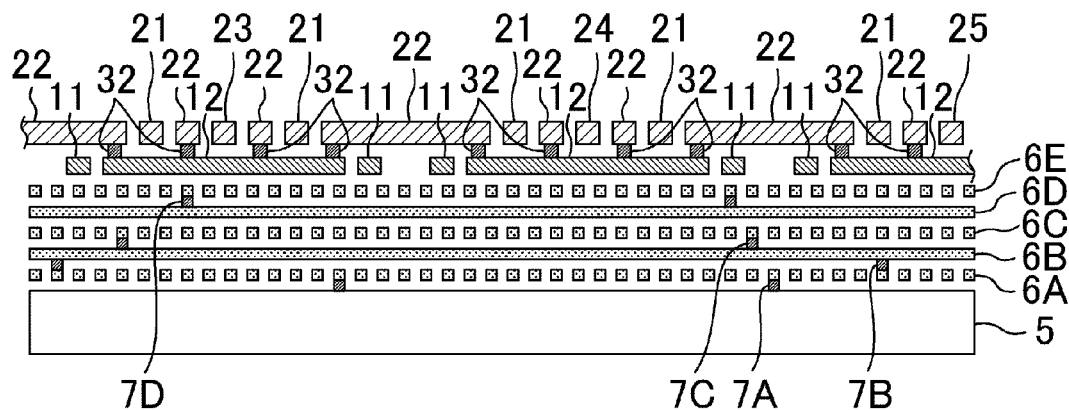
FIG. 11 is a cross-sectional view showing an example structure of an interconnect layer provided at a lower position than the first interconnect layer and the second interconnect layer described in the embodiments of the present disclosure (and the variations thereof).

FIG. 11 is a cross-sectional view showing an example structure of an interconnect layer provided at a lower position than the first interconnect layer and the second interconnect layer of the above embodiments. In FIG. 11, like reference characters have been used to designate the same elements as the elements of the first embodiment shown in FIGS. 1A-1C, FIG. 2 and FIG. 3, the variation of the first embodiment shown in FIGS. 4A-4E, FIG. 5 and FIG. 6, the second embodiment shown in FIGS. 7A-7C, or the variation of the second embodiment shown in FIGS. 8A-8E, and repetitive description is omitted. As shown in FIG. 11, five interconnect layers 6A, 6B, 6C, 6D and 6E provided with interconnects whose dimensions are smaller than the dimensions of the power supply interconnect 11 and ground interconnect 12, are sequentially formed from a bottom side, under the first interconnect layer in which the power supply interconnects 11 and the ground interconnects 12 are provided. The interconnect layers 6A-6E are formed on a semiconductor substrate 5 in which a transistor and others are formed. Further, the semiconductor substrate 5 and the interconnect layer 6A are electrically connected to each other via a contact 7A. The interconnect layer 6A and the interconnect layer 6B are electrically connected to each other via a contact 7B. The one interconnect layer 6B and the interconnect layer 6C are electrically connected to each other via a contact 7C. The interconnect layer 6D and the interconnect layer 6E are electrically connected to each other via a contact 7D.

In the above embodiments, the interconnects 11-15 of the first interconnect layer and the interconnects 21-25 of the second interconnect layer are copper interconnects. Instead, copper interconnects may be used for the first interconnect layer, and aluminium interconnects may be used for the second interconnect layer. In this case, the aluminium interconnects used for the second interconnect layer are aluminium interconnects for wire bonding. By applying the power supply interconnect structures of the above embodiments to at least this second interconnect layer, it is possible to obtain the same effect as in the above embodiments, that is, possible to provide a power supply interconnect mesh and a ground interconnect mesh having low resistances in which a voltage drop does not have a directional property.

In the above embodiments, the interconnect blocks 10 and 20 are in the shape of a rectangle (e.g., a square). However, the shapes of the interconnect blocks 10 and 20 are not specifically limited. Even if the interconnect blocks 10 and 20 are in the shape of any of a triangle, a hexagon, an octagon, etc., a ring interconnect or a spiral interconnect, etc., which corresponds to each shape of the blocks is provided, thereby making it possible to obtain the same effect as in the above embodiments, that is, possible to provide a power supply interconnect mesh and a ground interconnect mesh having low resistances in which a voltage drop does not have a directional property. Further, a plurality of shapes may be used as the shapes of the interconnect blocks 10 and 20 in the same chip, or the shape of the interconnect block 10 may differ from the shape of the interconnect block 20.

Figure 12A:
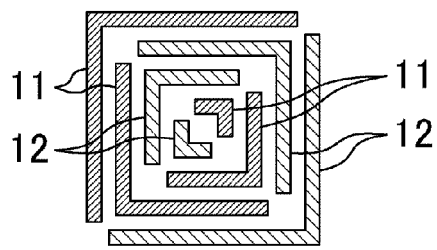
FIG. 12 shows plan views for illustrating example arrangements of interconnects which extend in two directions as the power supply interconnects and the ground interconnects described in the embodiments of the present disclosure (and the variations thereof).
Figure 12B:
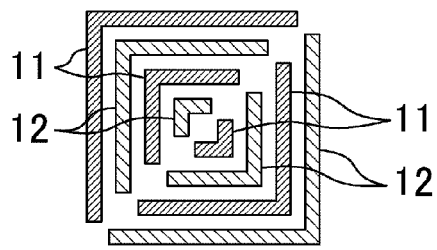
Figure 12C:
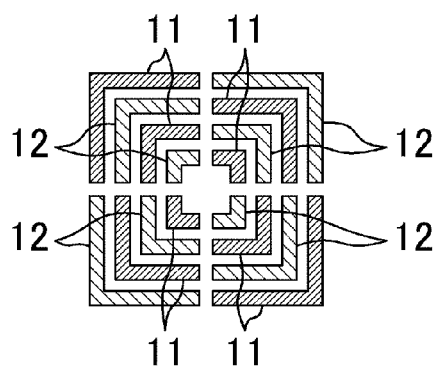

In the above embodiments, ring interconnects or spiral interconnects, etc., are used as the power supply interconnect 11 and the ground interconnect 12, and as the power supply interconnect 21 and the ground interconnect 22, which are arranged in the interconnect blocks 10 and 20. However, the interconnects which can be arranged as the power supply interconnect 11 and the ground interconnect 12, and as the power supply interconnect 21 and the ground interconnect 22, are not specifically limited as long as the interconnects extend in at least two or more directions. FIGS. 12A-12C are plan views showing example arrangements of interconnects which extend in two directions as the power supply interconnects 11 and the ground interconnects 12.

Figure 13:
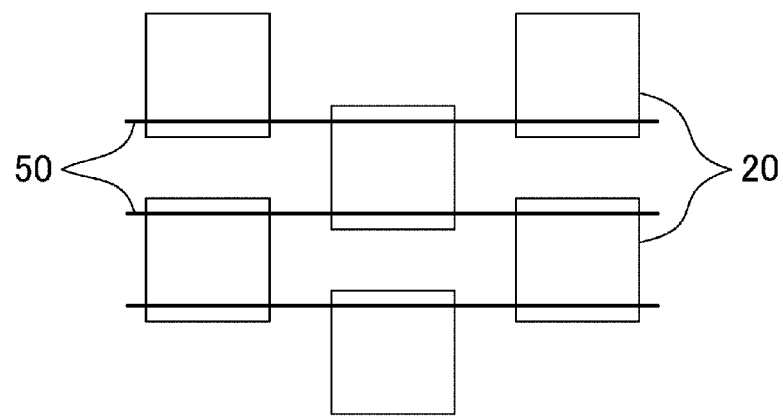
FIG. 13 is a plan view for schematically showing the way how power supply interconnects (or ground interconnects) of interconnect blocks arranged in a staggered manner in an upper interconnect layer are electrically connected to each other by a power supply interconnect (or a ground interconnect) provided in a lower interconnect layer so as to extend in one direction.
Figure 14:
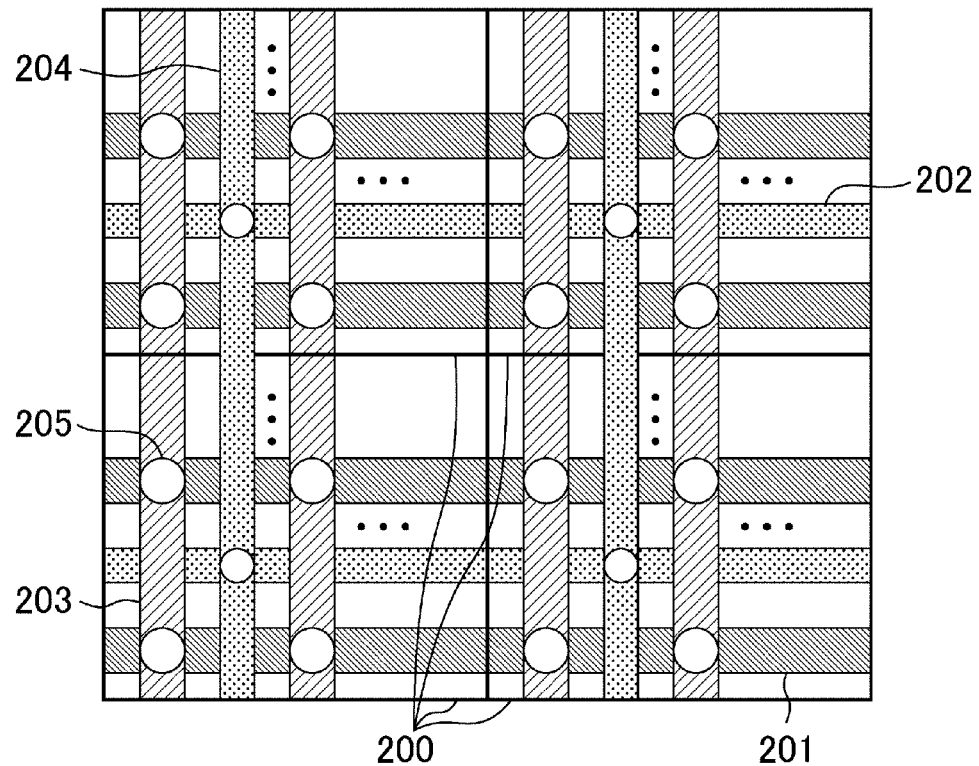
FIG. 14 shows an example arrangement of signal interconnects and power supply interconnects according to a conventional semiconductor device.
Figure 15:
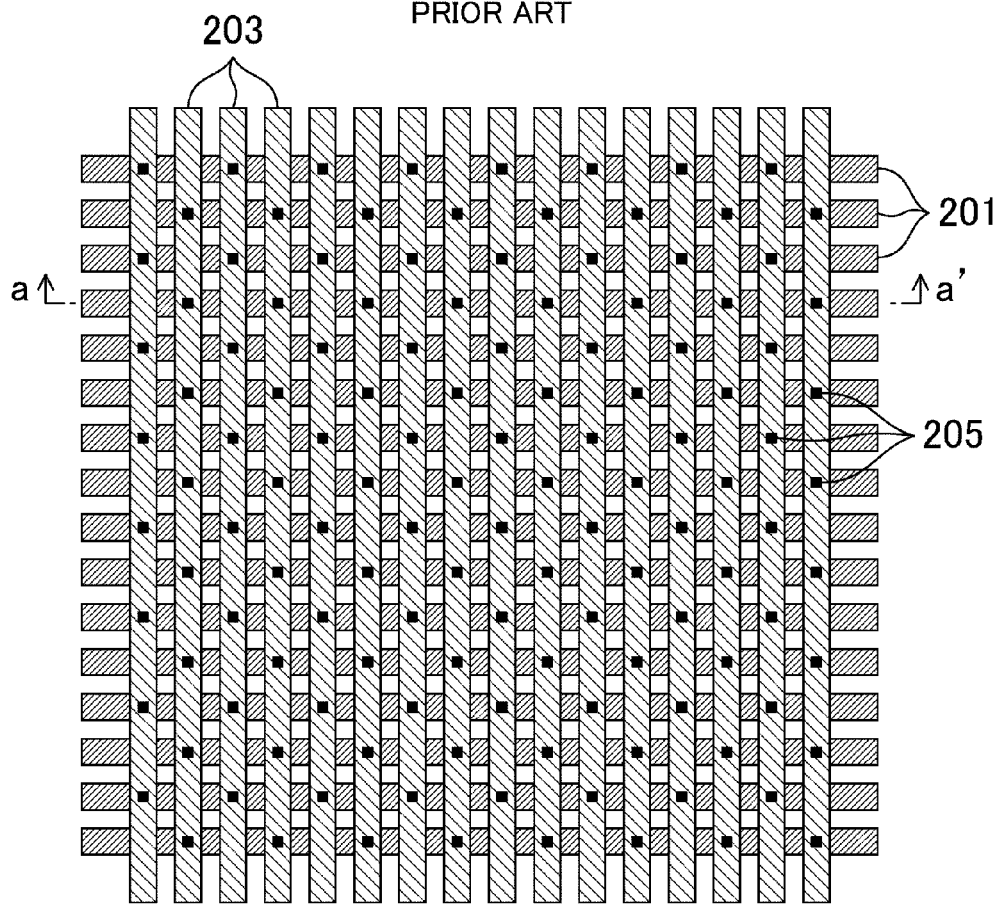
FIG. 15 is a top view which schematically shows a simplified pattern of the power supply interconnects of the conventional semiconductor device shown in FIG. 14.
Figure 16:
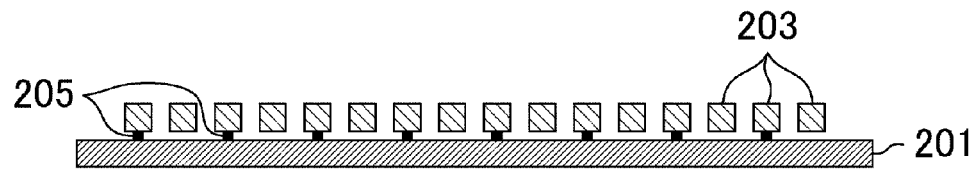
FIG. 16 is a cross-sectional view which schematically shows a simplified pattern of the power supply interconnects of the conventional semiconductor device shown in FIG. 14.
Figure 17:
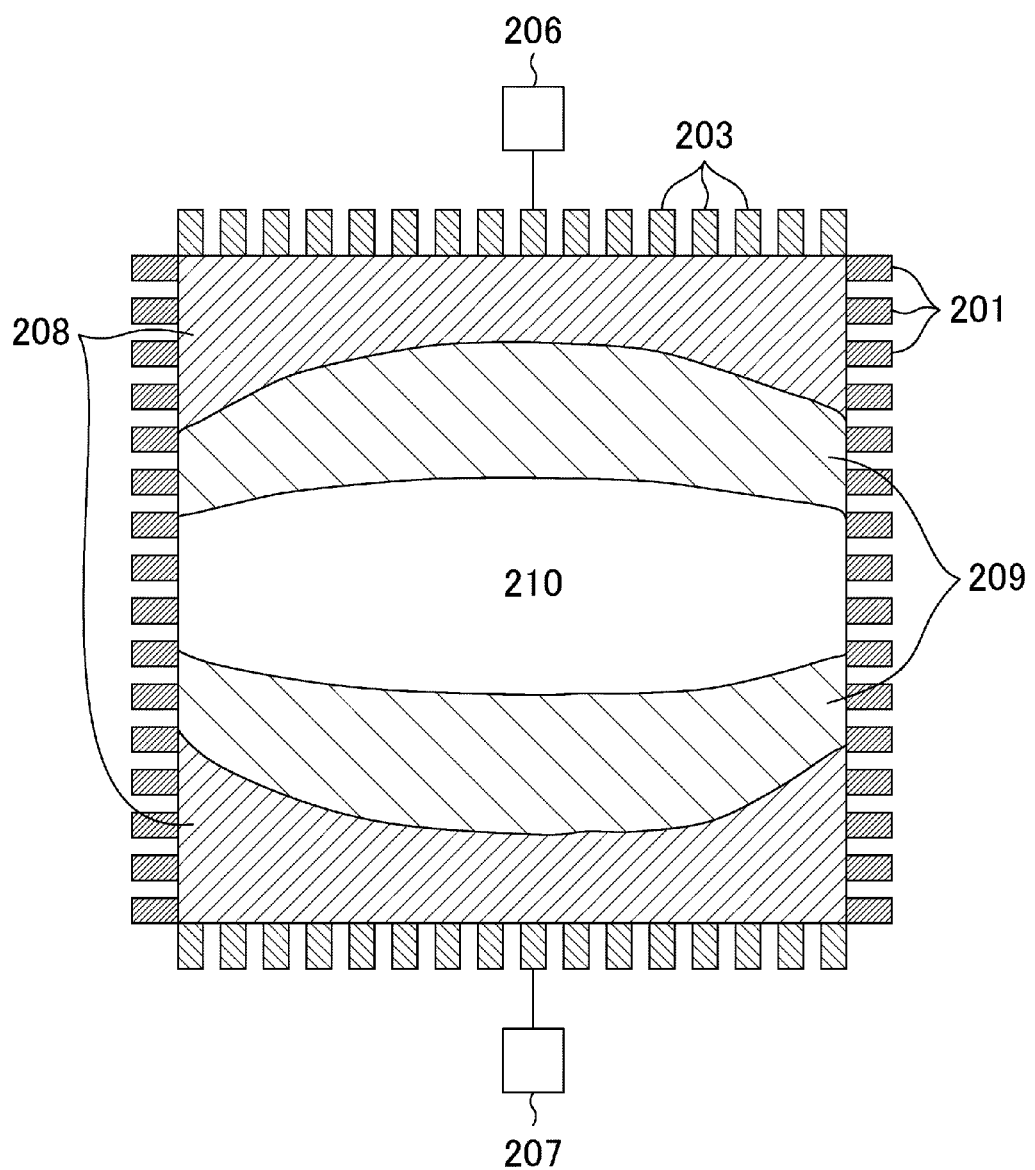
FIG. 17 shows an example voltage drop due to interconnect resistance at a time when a supply voltage is applied to the simplified pattern shown in FIG. 15.

In the above embodiments, the plurality of interconnect blocks 10 are arranged in a matrix in the first interconnect layer as a lower interconnect layer, and the plurality of interconnect blocks 20 are arranged in a matrix in the second interconnect layer as an upper interconnect layer. Instead, as shown, for example, in FIG. 13, the plurality of interconnect blocks 20 may be arranged in a staggered manner in the second interconnect layer as an upper interconnect layer, and a power supply interconnect (or a ground interconnect) 50 which extends in one direction may be provided in the first interconnect layer as a lower interconnect layer to electrically connect the power supply interconnect (or a ground interconnect) of one of two partially adjacent interconnect blocks 20 with the power supply interconnect (or a ground interconnect) of the other of the two partially adjacent interconnect blocks 20. This means that interconnect blocks do not have to be provided in the first interconnect layer as a lower interconnect layer. Alternatively, the plurality of interconnect blocks 10 may be arranged in a staggered manner in the first interconnect layer as a lower interconnect layer, and a power supply interconnect (or a ground interconnect) which extends in one direction may be provided in the second interconnect layer as an upper interconnect layer to electrically connect the power supply interconnect (or a ground interconnect) of one of two partially adjacent interconnect blocks 10 with the power supply interconnect (or a ground interconnect) of the other of the two partially adjacent interconnect blocks 10. This means that interconnect blocks do not have to be provided in the second interconnect layer as an upper interconnect layer.

As described above, according to the present disclosure, it is possible to effectively reduce a local voltage drop in a semiconductor device, and therefore, the semiconductor device can be stably operated, and a chip area can be reduced. The present disclosure is therefore useful.

What is claimed is:

1. A semiconductor device, comprising:
a semiconductor substrate;
a first layer disposed above the semiconductor substrate and forming a plurality of first interconnect blocks, each of the first interconnect blocks including a first interconnect with a first potential, the first interconnect extending in at least two or more directions, and a second interconnect with a second potential different from the first potential, the second interconnect extending in at least two or more directions; and
a second layer disposed above or under the first layer, the second layer including a third interconnect which connects to the first interconnect of each of two or more adjacent first interconnect blocks, and a fourth interconnect which connects to the second interconnect of each of two or more adjacent first interconnect blocks, wherein:
the second layer forms a plurality of second interconnect blocks in each of which the third interconnect and the fourth interconnect are arranged,
an arrangement of the first interconnect and the second interconnect in one first interconnect block is different from an arrangement of the first interconnect and the second interconnect in another first interconnect block, and
the first interconnect in one first inter connect block is arranged in parallel to and adjacent to the second interconnect in an adjacent first interconnect block which is adjacent to the one first interconnect block.

2. The semiconductor device of claim 1, wherein each of the third interconnect and the fourth interconnect extends in two or more directions.

3. The semiconductor device of claim 1, wherein
the first interconnect and the third interconnect have different resistances, and
the second interconnect and the fourth interconnect have different resistances.

4. The semiconductor device of claim 1, wherein
the first interconnect and the third interconnect are electrically connected to each other via a first contact, and
the second interconnect and the fourth interconnect are electrically connected to each other via a second contact.

5. The semiconductor device of claim 1, wherein
each of the first interconnect and the second interconnect is in the shape of a ring.

6. The semiconductor device of claim 1, wherein
each of the first interconnect and the second interconnect is in the shape of a spiral.

7. The semiconductor device of claim 1, wherein
a signal interconnect is arranged between the first interconnect blocks of the first layer.

8. The semiconductor device of claim 1, wherein
the semiconductor substrate is in the shape of a rectangle when viewed from above, and
the plurality of first interconnect blocks are arranged in a direction along sides of the semiconductor substrate.

9. The semiconductor device of claim 1, wherein
the semiconductor substrate is in the shape of a rectangle when viewed from above, and
the plurality of first interconnect blocks are arranged in an oblique direction relative to the direction along sides of the semiconductor substrate.

10. The semiconductor device of claim 9, wherein
the semiconductor substrate is in the shape of a square when viewed from above, and
the plurality of first interconnect blocks are arranged in a direction 45 degrees from the direction along sides of the semiconductor substrate.

11. The semiconductor device of claim 1, wherein
each of the third interconnect and the fourth interconnect is in the shape of a ring.

* * * * *